(12) United States Patent
Nomura

(10) Patent No.: US 10,717,155 B2
(45) Date of Patent: *Jul. 21, 2020

(54) LASER PROCESSING APPARATUS

(71) Applicant: DISCO CORPORATION, Tokyo (JP)

(72) Inventor: Hiroshi Nomura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 302 days.

This patent is subject to a terminal disclaimer.

(21) Appl. No.: 15/839,323

(22) Filed: Dec. 12, 2017

(65) Prior Publication Data

US 2018/0161927 A1 Jun. 14, 2018

(30) Foreign Application Priority Data

Dec. 13, 2016 (JP) ................................ 2016-241592

(51) Int. Cl.
| | | |
|---|---|---|
| *B23K 26/08* | (2014.01) | |
| *B23K 26/0622* | (2014.01) | |
| *B23K 26/364* | (2014.01) | |
| *B23K 26/18* | (2006.01) | |
| *B23K 26/40* | (2014.01) | |
| *H01L 21/78* | (2006.01) | |
| *B23K 103/00* | (2006.01) | |
| *B23K 26/073* | (2006.01) | |
| *H01L 21/67* | (2006.01) | |

(52) U.S. Cl.
CPC ...... *B23K 26/0853* (2013.01); *B23K 26/0622* (2015.10); *B23K 26/0884* (2013.01); *B23K 26/18* (2013.01); *B23K 26/364* (2015.10); *B23K 26/40* (2013.01); *H01L 21/78* (2013.01); *B23K 26/0736* (2013.01); *B23K 2103/50* (2018.08); *B23K 2103/56* (2018.08); *H01L 21/67132* (2013.01)

(58) Field of Classification Search
USPC ........................................ 219/121.11–121.86
See application file for complete search history.

(56) References Cited

U.S. PATENT DOCUMENTS 7,514,015 B2 * 4/2009 Elliott .................. B08B 7/0042
156/345.5

FOREIGN PATENT DOCUMENTS

JP 2004-022936 1/2004

* cited by examiner

*Primary Examiner* — Lori L Baker
(74) *Attorney, Agent, or Firm* — Greer Burns & Crain Ltd.

(57) ABSTRACT

A laser processing apparatus includes a cassette table for placing thereon a cassette in which a plurality of workpieces are accommodated, a carrying-out unit for carrying out the workpiece from the cassette placed on the cassette table, an X-axis direction moving unit for processing feed of a chuck table in the X-axis direction, a Y-axis direction moving unit for indexing feed of the chuck table in a Y-axis direction orthogonal to the X-axis direction, and a laser beam applying unit having a focusing unit for applying a laser beam to the workpiece held on the chuck table.

3 Claims, 10 Drawing Sheets

LASER PROCESSING APPARATUS

BACKGROUND OF THE INVENTION

Field of the Invention

The present invention relates to a laser processing apparatus which is capable of efficiently processing a plate-shaped workpiece such as a wafer, thereby enhancing productivity.

Description of the Related Art

A wafer formed with devices such as integrated circuits (ICs) or large scale integrations (LSIs) on a front surface thereof partitioned by division lines is processed along the division lines by a laser processing apparatus, and is divided into individual device chips, which are used for electrical apparatuses such as personal computers, mobile phones, and television sets.

As the laser processing apparatus, there has been known one that includes, at least, a cassette table for placing thereon a cassette in which a plurality of workpieces are accommodated, carrying-out means for carrying out the wafer from the cassette placed on the cassette table, temporary placing means for temporarily placing the wafer carried out by the carrying-out means, carrying means for carrying the wafer from the temporary placing means to a chuck table, imaging means for imaging the wafer held on the chuck table and detecting a region to be processed, and laser beam applying means including a focusing unit for applying a laser beam to the wafer held on the chuck table (see, for example, Japanese Patent Laid-Open No. 2004-022936). In the laser processing apparatus, the wafer can be processed with high accuracy by reciprocating the chuck table, which holds the wafer, in relation to the laser beam applying means.

SUMMARY OF THE INVENTION

According to the aforementioned laser processing apparatus, a wafer as a workpiece can be processed with high accuracy. However, in the above-mentioned related art, the moving base to which the chuck table with the wafer supported thereon is formed from stainless steel (specific gravity: 7.9). Therefore, there is a problem that high-velocity movement of the chuck table is restricted by the inertial force at the time of reciprocating the moving base in relation to the laser beam applying means, so that it is impossible to process the wafer efficiently.

Accordingly, it is an object of the present invention to provide a laser processing apparatus capable of efficient processing of a workpiece including a wafer.

In accordance with an aspect of the present invention, there is provided a laser processing apparatus for processing a plate-shaped workpiece by applying a laser beam to the workpiece, the laser processing apparatus including a cassette table for placing thereon a cassette in which a plurality of workpieces are accommodated, carrying-out means for carrying out the workpiece from the cassette placed on the cassette table, temporary placing means for temporarily placing the workpiece carried out by the carrying-out means, carrying means for carrying the workpiece from the temporary placing means to a chuck table, imaging means for detecting a region to be processed of the workpiece held on the chuck table, X-axis direction moving means for processing feed of the chuck table in an X-axis direction, Y-axis direction moving means for indexing feed of the chuck table in a Y-axis direction orthogonal to the X-axis direction, and laser beam applying means including a focusing unit for applying a laser beam to the workpiece held on the chuck table. The X-axis direction moving means includes a moving base for supporting the chuck table, an X-axis table having an X-axis guide rail for guiding the moving base in the X-axis direction, and a drive source for moving the moving base. The Y-axis direction moving means includes a Y-axis guide rail for guiding the X-axis table in the Y-axis direction, and a drive source for moving the X-axis table. The moving base is formed from a carbon fiber-reinforced plastic.

According to the laser processing apparatus of the present invention, the inertial force attendant on the reciprocating movement is reduced to ¼ times that in the case of the conventional moving base formed from stainless steel. For example, while the moving velocity at the time of putting the conventional moving base into high-velocity movement within a range limited by the size, of the apparatus is 1,000 mm/second at maximum, the moving velocity in the case of the moving base in the present invention can be raised to 2,000 mm/second, or approximately two times that in the conventional case. For this reason, it is possible, according to the present invention, to laser process the wafer efficiently.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
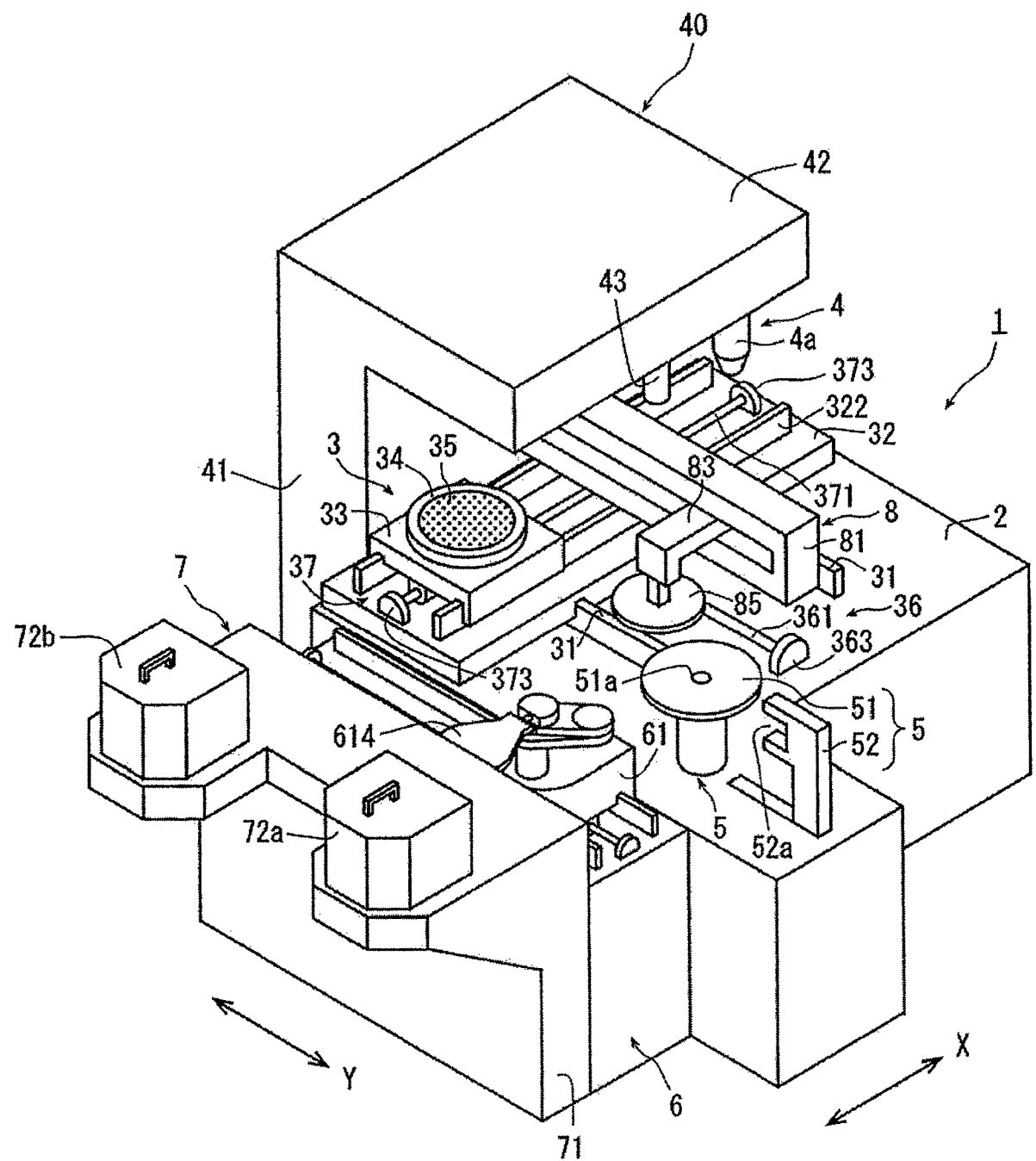
FIG. 1 is a general perspective view of a laser processing apparatus according to an embodiment of the present invention.

A preferable embodiment of a laser processing apparatus configured according to the present invention will be described in detail below, referring to the attached drawings. FIG. 1 depicts a perspective view of one embodiment of the laser processing apparatus configured according to the present invention. The laser processing apparatus 1 in the embodiment illustrated includes a stationary base 2, a holding table mechanism 3 which is disposed on the stationary base 2 and holds a workpiece, and laser beam applying means 4 for applying laser processing to the workpiece held by the holding table mechanism 3.

Main components of the laser processing apparatus 1 described in FIG. 1 will be described while referring to FIG. 2 which separately illustrates the main components. The holding table mechanism 3 includes a pair of Y-axis guide rails 31 disposed on the stationary base 2 in parallel to each other along a Y-axis direction indicated by arrow Y, an X-axis table 32 disposed on the Y-axis guide rails 31 so as to be movable in the Y-axis direction indicated by arrow Y, a pair of X-axis guide rails 322 disposed on an upper surface of the X-axis table 32 in parallel to each other along an X-axis direction indicated by arrow X, a moving base 33 disposed on the X-axis guide rails 322 so as to be movable in the X-axis direction indicated by arrow X, a chuck table 34 supported on the moving base 33, a suction chuck 35 that forms an upper surface of the chuck table 34 and is formed from a gas-permeable porous ceramic, Y-axis direction moving means 36 for moving the X-axis table 32 in the Y-axis direction along the Y-axis guide rails 31, and X-axis direction moving means 37 for moving the moving base 33 in the X-axis direction along the X-axis guide rails 322. Note that suction chuck 35 is connected to a suction pump (not depicted), and is configured to be able to suction hold a workpiece placed on an upper surface thereof.

The Y-axis direction moving means 36 includes a Y-axis linear rail 361 disposed between the two Y-axis guide rails 31 and extending in the Y-axis direction, and a Y-axis coil movable element 362 fitted to the Y-axis linear rail 361 in a movable manner and mounted to a lower surface of the X-axis table 32. The Y-axis linear rail 361 has a configuration in which, for example, N poles and S poles of a plurality of cylindrical permanent magnets are alternately joined to form a shaft-shaped body, and the plurality of cylindrical permanent magnets thus formed into the shaft-shaped body are disposed in a hollow cylindrical case formed of a non-magnetic material of stainless steel. Support members 363 as depicted in FIG. 2 (in FIGS. 1 and 2, only one of them is illustrated) are mounted to both end portions of the Y-axis linear rail 361 configured in this way, and the Y-axis linear rail 361 is attached to an upper surface of the support base 2 through the support members 363. The Y-axis direction moving means 36 including the Y-axis linear rail 361 and the Y-axis coil movable element 362 constitutes a so-called linear shaft motor serving as a drive source. When a current flows in the Y-axis coil movable element 362, an attracting force and a repelling force due to magnetic forces are repeatedly generated, whereby a thrust is generated. Therefore, the direction in which the Y-axis coil movable element 362 is moved along the Y-axis linear rail 361 can be changed by changing the direction of the current applied to the Y-axis coil movable element 362. Such a movement in the Y-axis direction is to move in a so-called indexing feed direction orthogonal to a processing feed direction of the chuck table 34, and acts as an indexing feeding mechanism.

The X-axis direction moving means 37 is configured in substantially the same manner as the Y-axis direction moving means 36, as a drive source for moving the moving base 33 in the X-axis direction. The X-axis direction moving means 37 includes an X-axis linear rail 371 which is disposed between the two X-axis guide rails 322 for guiding the moving base 33 in the X-axis direction and extends in the X-axis direction, and an X-axis coil movable element 372 fitted to the X-axis linear rail 371 in a movable manner and mounted to a lower surface of the moving base 33. The X-axis linear rail 371 has a configuration in which, for example, N poles and S poles of a plurality of cylindrical permanent magnets are alternately joined to form a shaft-shaped body, and the plurality of cylindrical permanent magnets thus formed into the shaft-shaped body are disposed in a hollow cylindrical case formed of a non-magnetic material of stainless steel. Support members 373 are mounted to both end portions of the X-axis linear rail 371 configured in this way, as depicted in FIG. 2, and the X-axis linear rail 371 is attached to an upper surface of the X-axis table 32 through the support members 373. The X-axis direction moving means 37 including the X-axis linear rail 371 and the X-axis coil movable element 372 constitutes a so-called linear shaft motor similarly to the Y-axis direction moving means 36. When a current flows in the X-axis coil movable element 372, an attracting force and a repelling force due to magnetic forces are repeatedly generated, whereby a thrust is generated. Accordingly, the direction in which the X-axis coil movable element 372 is moved along the X-axis linear rail 371 can be changed by changing the direction of the current applied to the X-axis coil movable element 372. Such a movement in the X-axis direction is to move in a so-called processing feed direction of the chuck table 34, and acts as a processing feeding mechanism.

Figure 3:
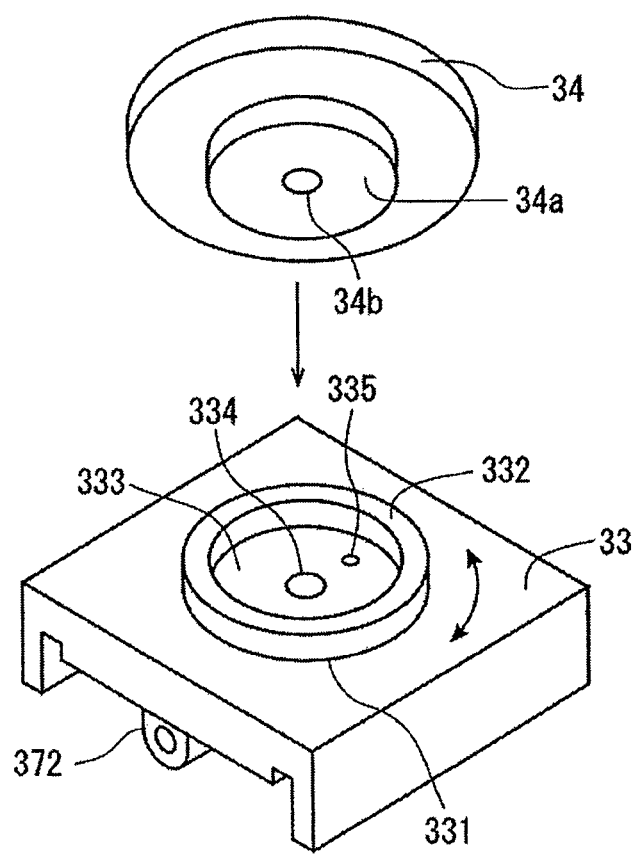
FIG. 3 is a perspective view depicting a chuck table and a moving base of the laser processing apparatus depicted in FIG. 1.

Referring to FIG. 3, the moving base 33 and the chuck table 34 supported on the moving base 33 will be described more specifically. In FIG. 3, the chuck table 34 fitted to the moving base 33 is illustrated in a separated state and as viewed from an oblique lower side. The chuck table 34 is formed from a lightweight ceramic, whereas the moving base 33 is formed from a carbon fiber-reinforced plastic (CFRP). The CFRP is formed to have a specific gravity of approximately 1.5 to 2.0, which varies to a certain extent depending on a molding method. The CFRP is an extremely lightweight blank material as compared to those formed of a metal such as stainless steel (specific gravity: 7.9), and is excellent in strength.

As illustrated in FIG. 3, a circular recess 331 is formed in the center of an upper surface of the moving base 33, and a bottomed hollow cylindrical member 332 is rotatably fitted or inserted in the recess 331. The hollow cylindrical member 332 is formed in a bottom portion 333 thereof with gas suction holes 334 and 335. The gas suction hole 334 formed in the center is connected to a ventilating hole 34b, formed in the center of a circular projection 34a formed at a lower surface of the chuck table 34, when the circular projection 34a is fitted or inserted in the hollow cylindrical member 332. Further, the gas suction hole 335 is formed to suction hole the chuck table 34 when the chuck table 34 is fitted or inserted in the hollow cylindrical member 332. The chuck table 34 to be placed on the moving base 33 is configured to be freely rotatable in the directions indicated by arrows in the figure, together with rotation of the hollow cylindrical member 332.

Returning to FIG. 2, for the laser beam applying means 4, a generally known configuration may be adopted. The laser beam applying means 4 includes a laser beam oscillator, an attenuator for output adjustment, a galvanometer scanner for adjusting the laser beam applying direction, a reflective mirror, a focusing lens included in the focusing unit 4a, etc. (omitted in illustration). Imaging means 43 is for detecting a region to be processed of a workpiece held by the chuck table 34. The imaging means 43 includes an optical system constituting a microscope, and an imaging element (charge-coupled device (CCD)), and is configured to be able to send an image signal obtained by imaging to control means and to display an image on display means (not depicted). Note that the control means is composed of a computer, and includes a central processing unit (CPU) for arithmetic processing according to a control program, a read only memory (ROM) for storing the control program and the like, a random access memory (RAM) capable of reading/writing for tentatively storing detected values, calculation results, etc., an input interface, and an output interface (omitted in illustration).

Figure 2:
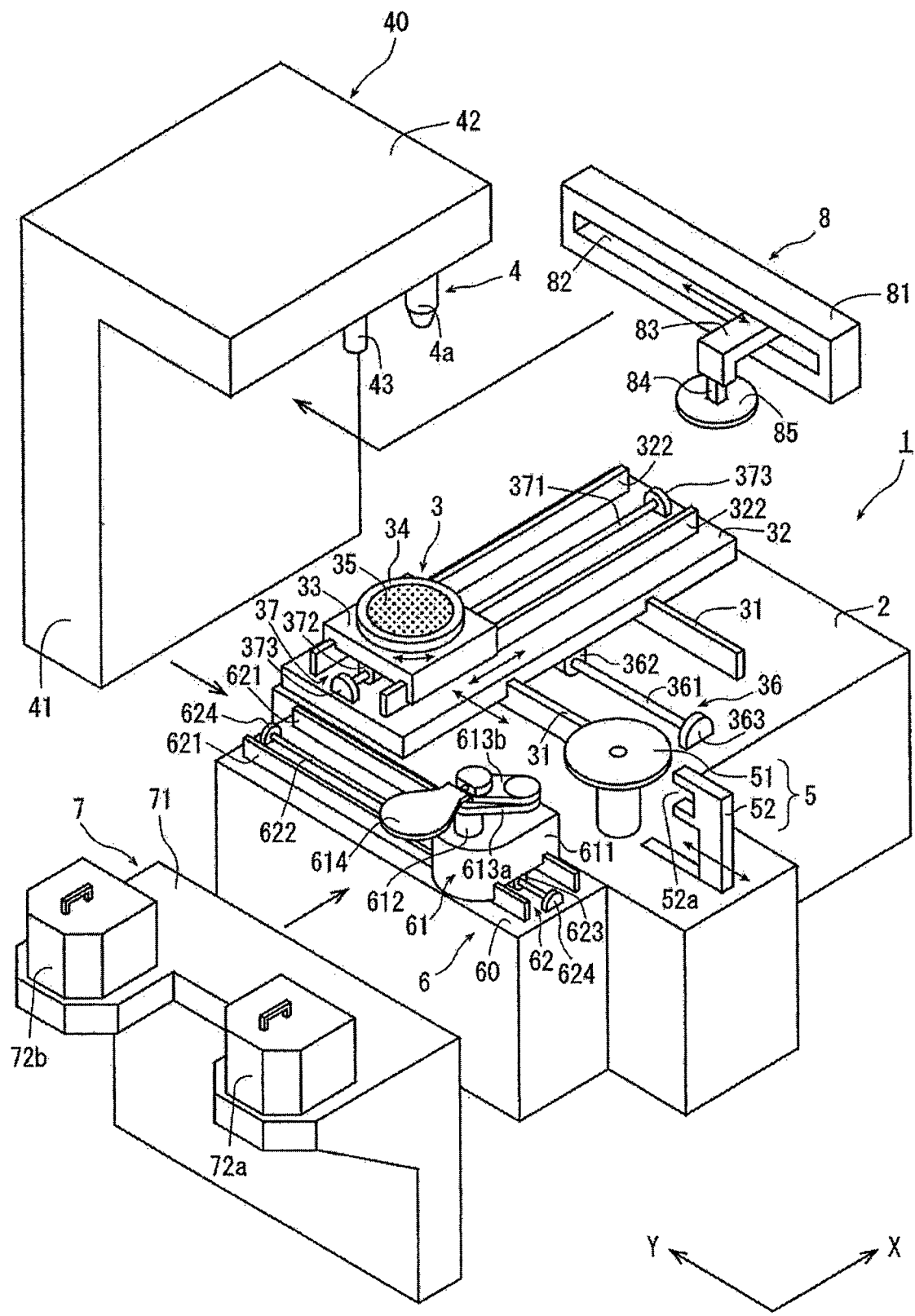
FIG. 2 is an exploded perspective view for separately explaining main portions of the laser processing apparatus depicted in FIG. 1.

As depicted in FIGS. 1 and 2, temporary placing means 5 is disposed on an upper surface of the stationary base 2 at a position in the Y-axis direction in relation to the X-axis table 32 on which the chuck table 34 is disposed in a slidable manner. The temporary placing means 5 includes a rotatable temporary placing table 51, and a periphery detecting section 52 for detecting a periphery of a workpiece temporarily placed on the temporary placing table 51. As depicted in FIG. 2, the periphery detecting section 52 is provided with an opening 52a opening laterally at the height of the temporary placing table 51, and a light emitting element is provided on the upper side of the opening 52, whereas a light receiving element is provided at that position on the lower side of the opening 52 which is opposed to the light emitting element (details will be described later). Further, the periphery detecting section 52 is configured to be movable in the directions indicated by arrows in the figure, namely, in the directions for moving toward and away from the temporary placing table 51 by a driving mechanism disposed inside the stationary base 2. Note that the temporary placing table 51 includes a transparent resin plate, and rotational angle of the temporary placing table 51 is detected by a rotational angle sensor (not depicted).

In the laser processing apparatus 1 in the present embodiment, as depicted in FIG. 2, carrying-out means 6 is provided at a position which is adjacent, in the X-axis direction, to a region in which the temporary placing means 5 and the holding table mechanism 3 are disposed on the stationary base 2. The carrying-out means 6 is provided with a carrying-out mechanism mount base 60, a carrying-out mechanism 61, and carrying-out mechanism moving means 62 for moving the carrying-out mechanism 61 in the Y-axis direction.

The carrying-out mechanism 61 includes a carrying-out moving base 611, a hollow cylindrical member 612 advanced and retracted in the vertical direction by an air cylinder incorporated in the carrying-out moving base 611, a flat plate-shaped first arm section 613a one end portion of which is rotatably connected to an upper end portion of the hollow cylindrical member 612, a second arm section 613b one end portion of which is rotatably connected to the other end portion of the first arm section 613a, and a robot hand 614 connected to the other end portion of the second arm section 613b. A lower surface of the robot hand 614 is formed with a plurality of suction holes (omitted in illustration), which are connected to a suction source through the hollow cylindrical member 612 and the first and second arm sections 613a and 613b, so that sucking the workpiece and letting off the workpiece can be performed by controlling the operation/non-operation of the suction source. Note that the robot hand 614 can perform an action for inverting upside down through a support portion at the other end portion on the second arm section 613b side, whereby its surface formed with the suction holes can be directed to the upper side.

The carrying-out mechanism moving means 62 is configured substantially the same manner as the aforementioned Y-axis direction moving means 36 and X-axis direction moving means 37. The carrying-out mechanism moving means 62 includes two carrying-out guide rails 621 disposed on an upper surface of the carrying-out mechanism mount base 60 in the Y-axis direction, a linear rail 622 which is disposed between the carrying-out guide rails 621 and extends in the Y-axis direction, and a coil movable element 623 fitted to the linear rail 622 in a movable manner and mounted to a lower surface of the carrying-out moving base 611. The linear rail 622 is configured in the same manner as the Y-axis linear rail 361 and the X-axis linear rail 371 which constitute the Y-axis direction moving means 36 and the X-axis direction moving means 37, respectively. Support members 624 are mounted to both end portions of the linear rail 622, and the linear rail 622 is attached to an upper surface of the carrying-out mechanism mount base 60 through the support members 624. The carrying-out mechanism moving means 62 including the linear rail 622 and the coil movable element 623 constitutes a so-called linear shaft motor. When a current flows in the coil movable element 623, an attracting force and a repelling force due to magnetic forces are repeatedly generated, whereby a thrust is generated. Therefore, the direction in which the coil movable element 623 is moved along the linear rail 622 can be changed by changing the direction of the current applied to the coil movable element 623.

A housing 40 incorporating laser beam applying means 4 is provided adjacently to the stationary base 2, in such a manner as to be along the X-axis table 32 disposed on the stationary base 2. The housing 40 includes a vertical wall section 41 extending vertically upward from a floor surface, and a horizontal wall section 42 extending horizontally from an upper end of the vertical wall section 41. As depicted in FIG. 1, carrying means 8, the imaging means 43, and the focusing unit 4a of the laser beam applying means 4 are disposed, in the state of being aligned in the X-axis direction, on a lower surface of a tip portion of the horizontal wall section 42.

As depicted in the figure, a cassette placing mechanism 7 is disposed in such a manner that the carrying-out means 6 is located between the stationary base 2 and the cassette placing mechanism 7 in the X-axis direction of the stationary base 2. The cassette placing mechanism 7 is provided with an unprocessed workpiece cassette 72a in which to accommodate unprocessed workpieces, a processed workpiece cassette 72b in which to accommodate processed workpieces, and a cassette table 71 on which the unprocessed workpiece cassette 72a and the processed workpiece cassette 72b are disposed in the state of being aligned in the Y-axis direction. It is preferable that the unprocessed workpiece cassette 72a is disposed at a position near the temporary placing means 5, whereas the processed workpiece cassette 72b is disposed on the side near the receiving position of the chuck table 34, as depicted in the figure. Note that the "receiving position" of the chuck table 34 refers to a position with which the center of the chuck table 34 coincides on a straight line drawn in the Y-axis direction from the center of the temporary placing table 51 when the chuck table 34 is moved in the X-axis direction on the X-axis table 32.

As depicted in FIG. 1, the carrying means 8 that sucks the workpiece on the temporary placing table 51 and carries the workpiece onto the chuck table 34 located at the receiving position is provided on the lower surface of the horizontal wall section 42 of the housing 40. In FIG. 2, the carrying means 8 is illustrated on the upper side in the state of being separated from the horizontal wall section 42. Describing more specifically based on the figure, the carrying means 8 includes a casing 81 incorporating a known belt mechanism therein, an opening 82 opening in a side wall of the casing 81 in a longitudinal direction, a carrying arm 83 which is supported by the belt mechanism incorporated in the casing 81 and extends to the outside from the opening 82, a rod 84 mounted to a tip portion of the carrying arm 83 in such a manner that it can be advanced and retracted in regard of a downward direction, and a sucker pad 85 supported by a tip portion of the rod 84. The sucker pad 85 is formed with a plurality of suction holes on the lower surface side (not depicted), and is connected to a suction source (not depicted) through the rod 84 and the carrying arm 83 so that a workpiece can be sucked or let off by the lower surface side of the sucker pad 85.

The laser processing apparatus 1 configured according to the present invention generally has the above-mentioned configuration, and its operation will be described based on FIGS. 4A to 10. Note that in FIGS. 4A and 10, the housing 40 is omitted for convenience of explanation.

In performing laser processing by the laser processing apparatus 1 in the present embodiment, an operator places on the cassette table 71 of the cassette placing mechanism 7 the unprocessed workpiece cassette 72a in which unprocessed workpieces (in the present embodiment, silicon wafers W) are accommodated, and the processed workpiece cassette 72b which is prepared in an empty state for accommodating the processed wafers W. Note that the laser processing apparatus 1 in the present embodiment is for performing laser processing consisting in applying a laser beam of such a wavelength as to be transmitted through the wafer W to the wafer W so as thereby to form a modified layer inside the wafer W. The wafers W, each with a protective tape adhered to its front surface side on which devices are formed, are accommodated in the unprocessed workpiece cassette 72a at predetermined intervals, with their front surface side up.

Figure 4A:
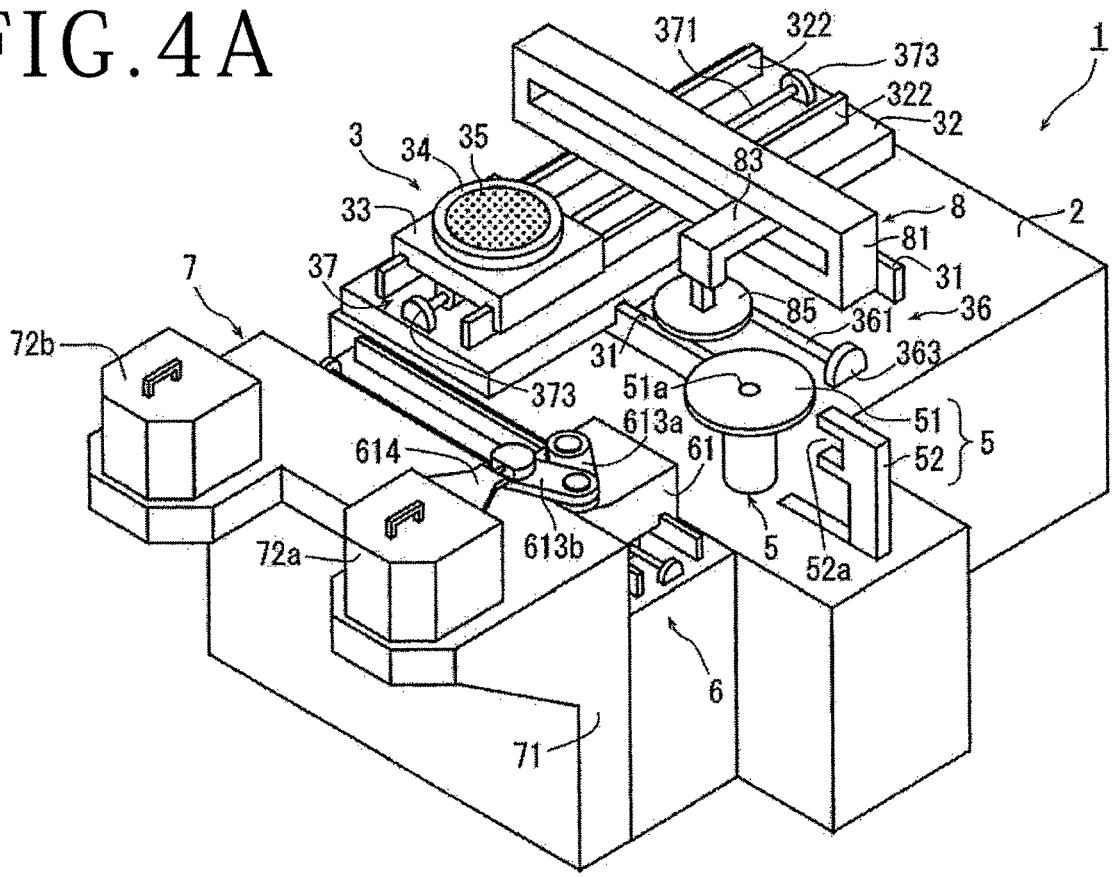
FIGS. 4A and 4B are perspective views for explaining an operation of a carrying-out mechanism of the laser processing apparatus depicted in FIG. 1.

When the start of laser processing is commanded to the laser processing apparatus 1 by the operator, first, the carrying-out mechanism moving means 62 is operated to position the carrying-out moving base 611 of the carrying-out mechanism 61 in front of the unprocessed workpiece cassette 72a. When the carrying-out mechanism 61 has been positioned in front of the unprocessed workpiece cassette 72a, the robot hand 614 is advanced into the unprocessed workpiece cassette 72a in order to carry out an unprocessed wafer W accommodated in the unprocessed workpiece cassette 72a, as depicted in FIG. 4A. In this instance, the surface formed with the suction holes of the robot hand 614 is directed to the upper side. In the unprocessed workpiece cassette 72a, a plurality of unprocessed wafers W are accommodated in a horizontal state and at predetermined vertical intervals. The robot hand 614 is advanced to the lower surface side of a predetermined wafer W in a state in which the robot hand's surface formed with the suction holes is directed up, and the back surface side of the unprocessed wafer W is sucked from below.

Figure 4B:
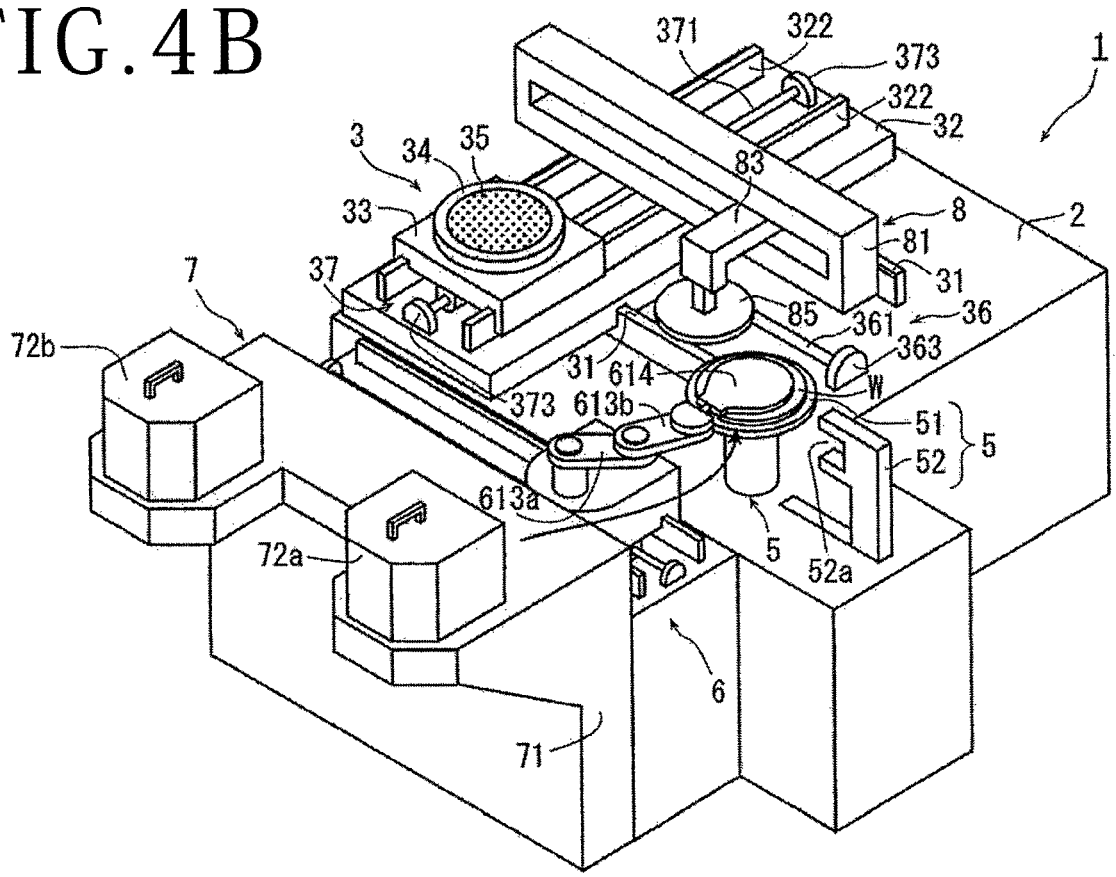

When the back surface of the unprocessed wafer W is sucked by the suction hole-formed surface of the robot hand 614 inside the unprocessed workpiece cassette 72a, the first arm 613a and the second arm 613b are rotated appropriately to thereby take out the unprocessed wafer W from the unprocessed workpiece cassette 72a, and, as depicted in FIG. 4B, the wafer W sucked by the robot hand 614 is moved toward the temporary placing table 51. During this operation, the robot hand 614 is rotated in such a manner that the suction hole-formed surface thereof is directed downward, namely, that the surface holding the wafer W thereon is directed downward. After the movement onto the temporary placing table 51, the hollow cylindrical member 612 is lowered to thereby bring the wafer W into contact with the upper surface of the temporary placing table 51, and the operation of the suction source is stopped, to release the sucked state. Note that as depicted in FIG. 4A, the temporary placing table 51 is also provided in its center with a suction hole connected to the suction source, so that when suction through the suction hole 51a on the temporary placing table 51 side is conducted simultaneously with the releasing of the sucked state on the robot hand 614 side, the wafer W can be smoothly sucked onto the temporary placing table 51. In this way, the unprocessed wafer W is held on the temporary placing table 51, with its back surface side up.

Figure 5A:
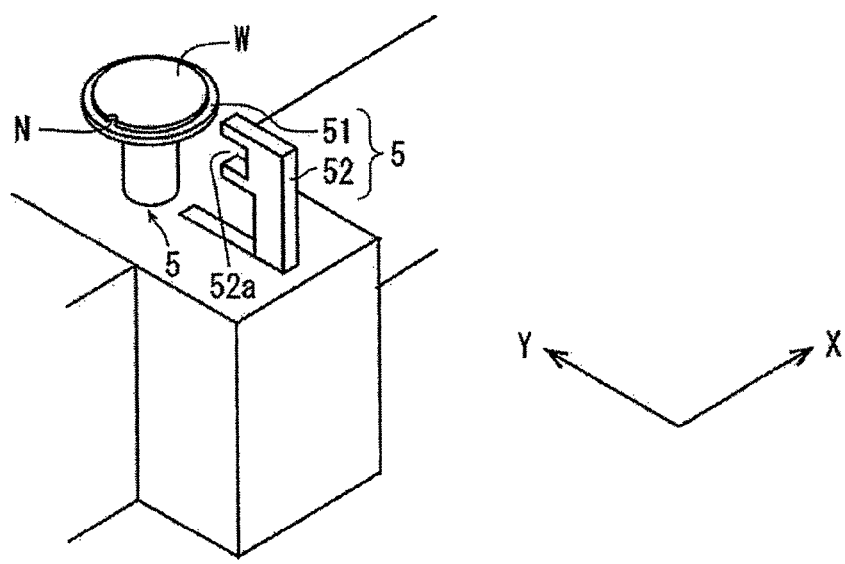
FIGS. 5A to 5C are schematic views for explaining an operation of a periphery detecting section of the laser processing apparatus depicted in FIG. 1.
Figure 5B:
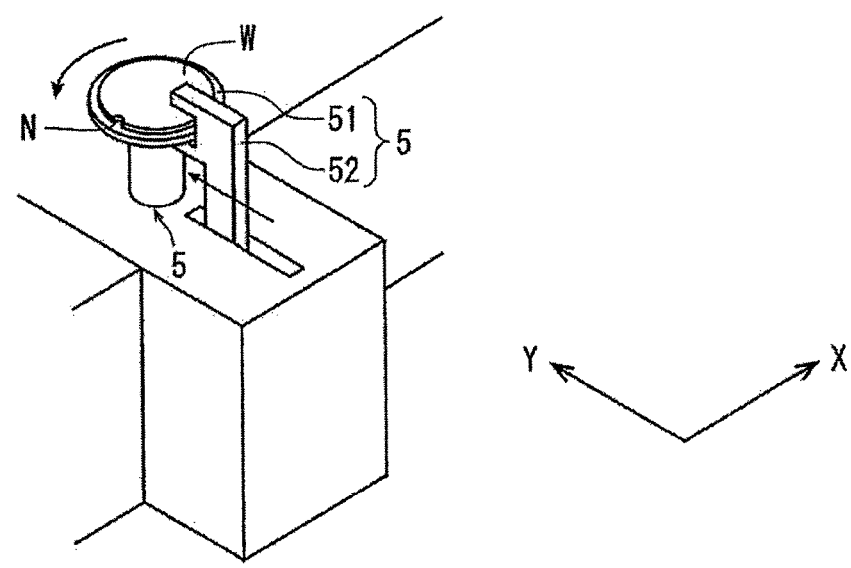
Figure 5C:
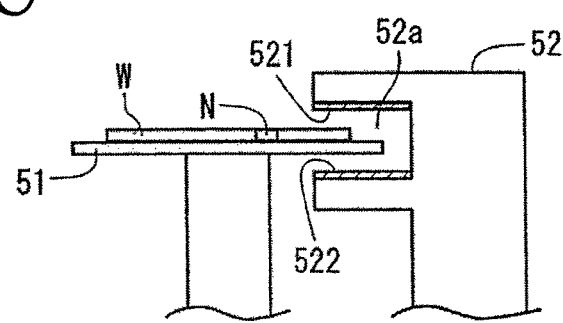

When the unprocessed wafer W is suction held on the temporary placing table 51, the periphery detecting section 52 is operated to perform a periphery detecting step of detecting the peripheral portion of the wafer W and the position of a notch N indicative of the crystal orientation of the wafer W. The periphery detecting step will be described more specifically. As depicted in FIG. 5A, at the time of placing the wafer W on the temporary placing table 51, the periphery detecting section 52 has been moved into a retracted position of being spaced from the temporary placing table 51 such as not to contact the wafer W. After the wafer W is placed on the temporary placing table 51, driving means (not depicted) is operated to move the periphery detecting section 52 to the temporary placing table 51 side, to let a peripheral portion of the temporary placing table 51 advance into the opening 52a, as depicted in FIG. 5B. In this instance, the size (diameter) of the wafer W to be processed is preliminarily registered in control means (not depicted), and a periphery position of the wafer W is positioned substantially at the center of the opening 52a, as depicted in FIG. 5C. As illustrated in the figure, a light emitting element 521 having a predetermined length in the left-right direction in the figure is disposed on the upper side of the opening 52a, and a light receiving element 522, for example, a line sensor, is disposed on the lower side of the opening 52a at a position opposed to the light emitting element 521. The operation of the periphery detecting section 52 will be described more.

In the case where the wafer W on the temporary placing table 51 is carried onto the chuck table 34 located at the above-mentioned receiving position by use of the carrying means 8, the center position of the wafer W must be situated on the Y-axis line passing through the center of the chuck table 34. However, when the unprocessed wafer W is placed onto the temporary placing table 51 by the aforementioned carrying-out means 6, it is difficult to place the wafer W such that the center position of the wafer W coincides accurately with the center position of the temporary placing table 51. When the wafer W whose center position is deviated on the temporary placing table 51 is carried from the temporary placing table 51 onto the chuck table 34 by the carrying means 8 in the deviated state, a deviation results between the center of the chuck table 34 and the center of the wafer W. In view of this, in the present embodiment, the periphery of the wafer W and the position of the notch N indicative of the crystal orientation of the wafer W are detected by use of the periphery detecting section 52, whereby the center position of the wafer W suction held on the temporary placing table 51 and the direction in which the notch N is positioned are grasped. The detection method will be described below.

In the state as depicted in FIG. 5C, the light emitting element 521 and the light receiving element 522 are operated, and the temporary placing table 51 is rotated in the direction indicated in FIG. 5B by use of driving means (not depicted). As aforementioned, the temporary placing table 51 includes a transparent plate, and the rotational position thereof has been detected. Therefore, a region where light radiated from the light emitting element 521 is shielded by the wafer W and a region where the wafer W is absent and the light is not shielded but reaches the light receiving element 522 are distinguished from each other, and an outer edge shape of the wafer W on the temporary placing table 51 is detected in correspondence with the rotational angle of the temporary placing table 51. In addition, with the outer edge shape of the wafer W thus grasped, the notch N indicative of the crystal orientation of the wafer W can also be detected.

Figure 6A:
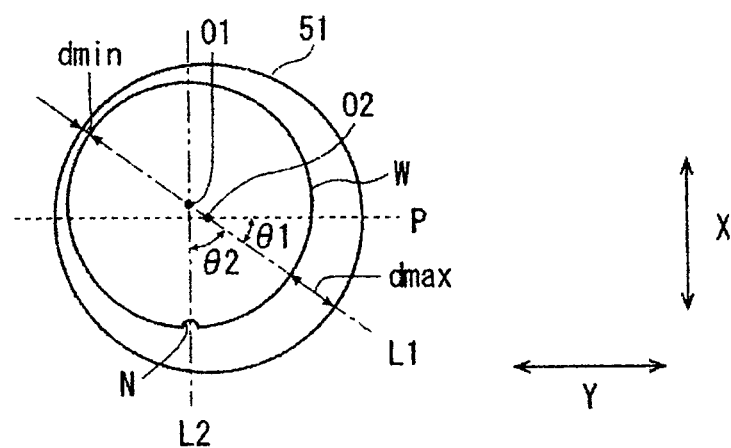
FIGS. 6A and 6B are plan views for explaining a calculation method for calculating a deviation amount of a wafer on a temporary placing table by the periphery detecting section depicted in FIGS. 5A and 5B.
Figure 6B:
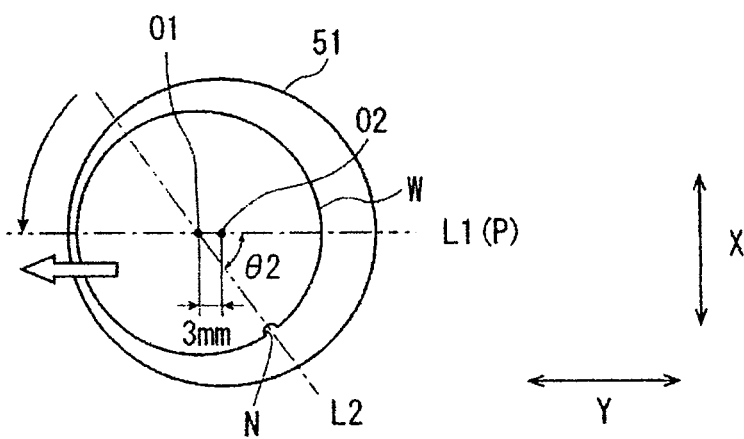

Referring to FIGS. 6A and 6B, a method of calculating the positional deviation amount of the wafer W relative to the temporary placing table 51 and the angle thereof will be described. As depicted in FIG. 6A, when the outer edge shape of the wafer W is detected in correspondence with the rotational angle of the wafer W by the aforementioned periphery detecting section 52, a minimum dmin of the distance of the outer edge shape from an outer edge of the temporary placing table 51 preliminarily stored and a maximum dmax of the distance are grasped together with the rotational angle position. In addition, when a straight line L1 (indicated by alternate long and short dash line) connecting the positions where the minimum dmin and the maximum dmax are obtained is specified, to what extent a center O1 of the wafer W is deviated toward the dmin side from a center O2 of the temporary placing table 51 is grasped from the following expression (1), since the straight line L1 necessarily pass the center O1 of the wafer W and the center O2 of the temporary placing table 51 whose position is preliminarily specified.

$$[dmax-dmin]/2=\text{deviation amount} \quad (1)$$

For example, where the maximum dmax in the present embodiment is 8 mm and the minimum dmin is 2 mm, it is gasped from calculation of the deviation amount based on the above expression (1) that the center O1 of the wafer W is deviated by 3 mm toward the minimum dmin side from the center O2 of the temporary placing table 51. In addition, when the straight line L1 is detected by the periphery detecting section 52, an inclination angle $\theta 1$ of the straight line L1 relative to the Y-axis direction (indicated by a dotted line P) is grasped, and the position of the notch N is also grasped. Therefore, an angle $\theta 2$ between a straight line L2 (indicated by alternate long and two short dashes line) connecting the center of the wafer W and the notch N and the straight line L1 is also grasped. The position of the wafer W, the deviation amount, and the angle as above are stored in the memory of the control means (not depicted).

When the deviation amount (3 mm) of the position of the wafer W on the temporary placing table 51 and the direction ($\theta 1$) thereof have been grasped as aforementioned, the temporary placing table 51 is rotated by $\theta 1$, as depicted in FIG. 6B, to cause the straight line L1 and the straight line P indicative of the Y-axis direction to coincide with each other. As a result, the center O1 of the wafer W and the center O2 of the temporary placing table 51 are aligned in the Y-axis direction, and the center O1 of the wafer W is deviated by 3 mm in the Y-axis direction from the center O2 of the temporary placing table 51. It is grasped, simultaneously with this, that the inclination angle of the notch N relative to the Y-axis direction (straight line P) is $\theta 2$.

Figure 7A:
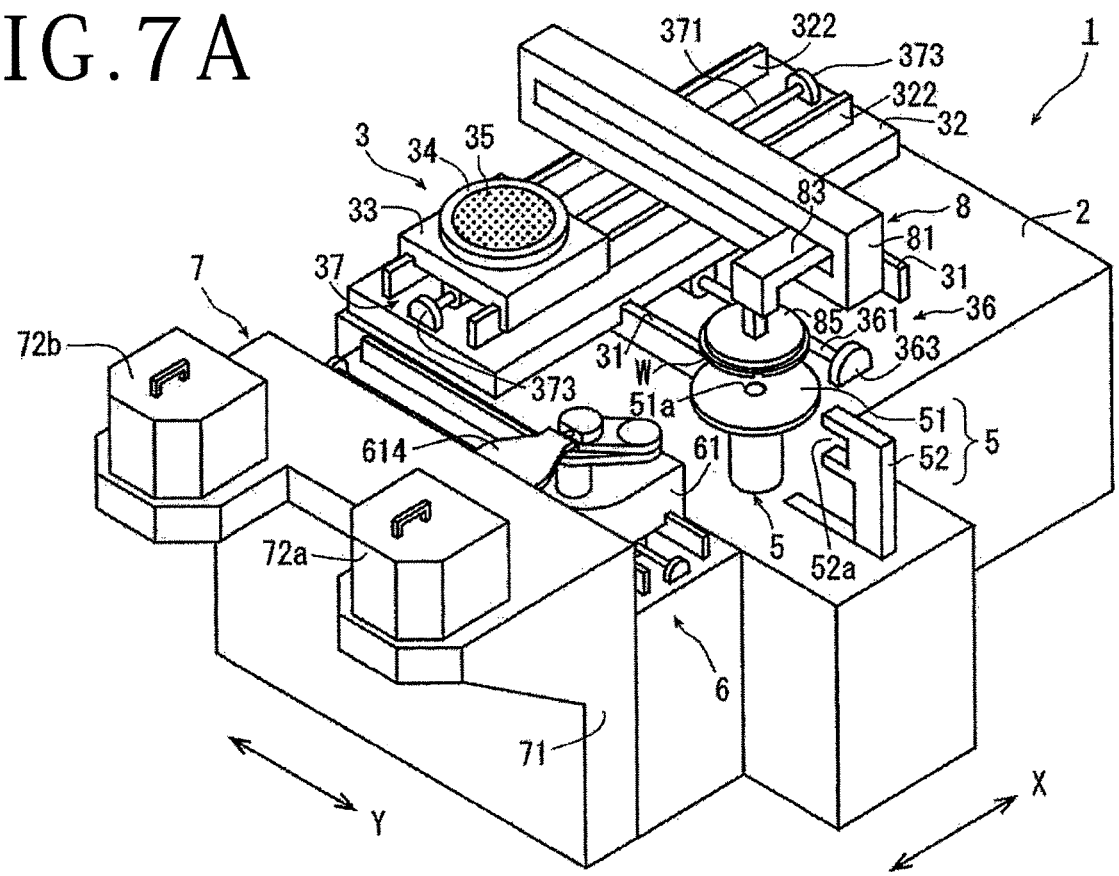
FIGS. 7A and 7B are perspective views for explaining an operation of a carrying mechanism of the laser processing apparatus depicted in FIG. 1.

When the temporary placing table 51 has been rotated by $\theta 1$, a carrying step of carrying the wafer W onto the chuck table 34 is then conducted by use of the carrying means 8. As depicted in FIG. 7A, the carrying arm 83 of the carrying means 8 is operated by driving means (not depicted) to position the sucker pad 85 into a position on the upper side of the temporary placing table 51, the rod 84 is extended and lowered, to bring the sucker pad 85 into contact with the wafer W, and the suction source (not depicted) is operated so that the wafer W is sucked by the sucker pad 85. In this instance, since the sucker pad 85 is so set that its center always coincides with the center O2 of the temporary placing table 51, the wafer W is sucked by the sucker pad 85 in a state in which the center O1 of the wafer W is deviated by 3 mm in the Y-axis direction from the center of the sucker pad 85.

Figure 7B:
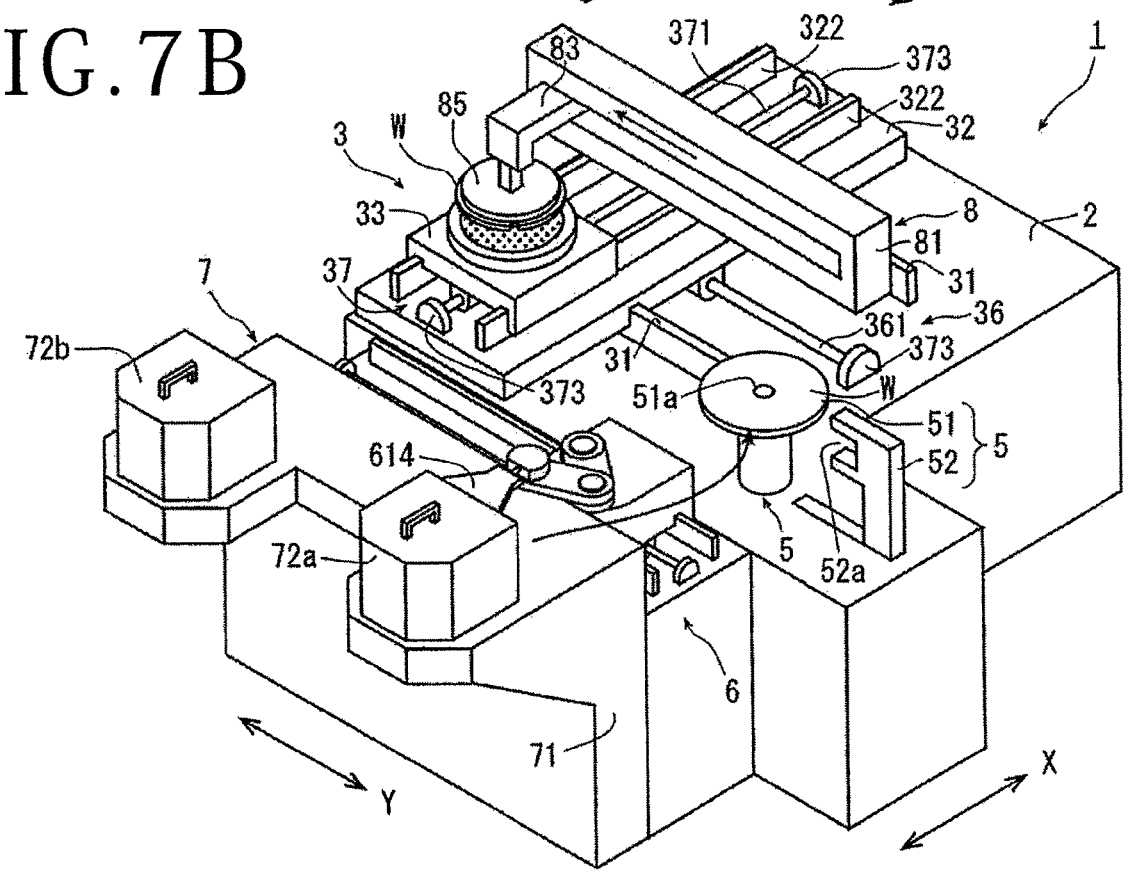

When the wafer W has been sucked by the sucker pad 85, the rod 84 is shrunk to raise the sucker pad 85, and the carrying arm 83 as is directly moved in the Y-axis direction, as depicted in FIG. 7B. In this instance, the chuck table 34 is positioned in a position at which its center is aligned with the center O2 of the temporary placing table 51 in the Y-axis direction, that is, positioned in the receiving position, so that by moving the carrying arm 83 in the Y-axis direction by a prescribed amount, it is possible to cause the center of the sucker pad 85 and the center of the chuck table 34 located in the receiving position to coincide with each other. Here, since it is grasped that the wafer W sucked onto the sucker pad 85 sucked in the state of being deviated by 3 mm in the Y-axis direction and this is stored in the control means, as aforementioned, the moving amount is corrected by 3 mm at the time of carrying the wafer W by the carrying arm 83. In other words, a distance smaller than the prescribed amount by 3 mm is the moving amount for the carrying arm 83. Then, the carrying arm 83 is moved by the distance corrected in relation to the prescribed amount, as depicted in FIG. 7B, whereon the wafer W is positioned in a position where the center of the wafer W and the center of the chuck table 34 coincide with each other in plan view, so that by extending the rod 84 to lower the sucker pad 85, the wafer W is placed on the chuck table 34 in a state where their centers coincide with each other. When the wafer W has been placed on the chuck table 34, the operation of the suction means on the sucker pad 85 ide is stopped, whereas the suction means for acting on the suction chuck 35 forming the holding surface of the chuck table 34 is operated, to suction hold the wafer W. Note that in this instance, the wafer W is placed on the chuck table 34 in a state in which its front surface side on which the devices are formed is placed on the chuck table 34, with a protective tape (not depicted) therebetween.

Figure 8A:
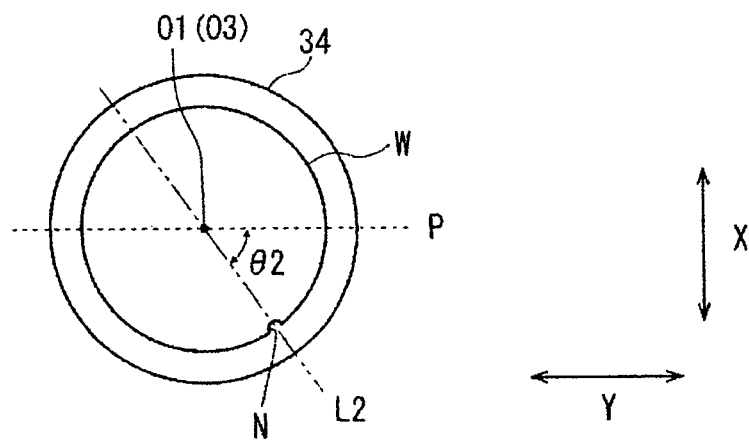
FIGS. 8A and 8B are plan views for explaining an operation of correcting the position of a notch in the wafer held on the chuck table.
Figure 8B:
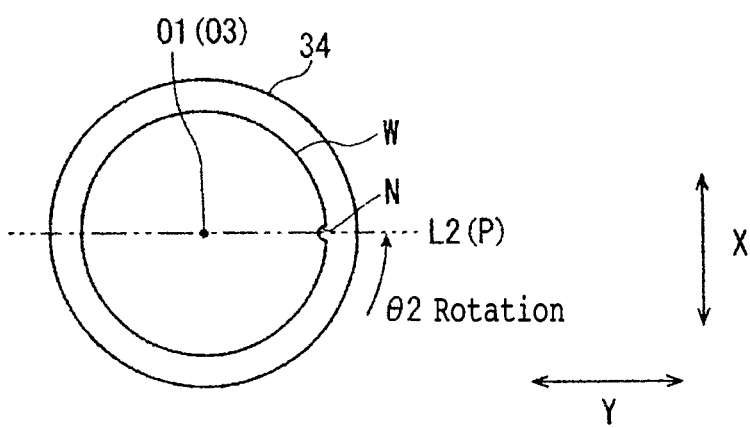

As depicted in FIG. 8A, according to the aforementioned carrying means 8, the wafer W is placed on the chuck table 34 with its center O1 positioned accurately on a center O3 of the chuck table 34. In this state, however, the position of the notch N in the wafer W is deviated by the angle $\theta 2$ in relation to the prescribed direction indicated by the dotted line P, as indicated by the straight line L2. As aforementioned, the $\theta 2$ has been detected by the periphery detecting section 52 in the state where the wafer W is placed on the temporary placing table 51 and been stored in the memory of the control means. Therefore, while referring to the value of θ2 stored in the control means, the chuck table 34 is moved by θ2 to thereby move the notch N into a prescribed position, as depicted in FIG. 8B. As a result, the position of the notch N is corrected, and the crystal orientation of the wafer W is positioned in a predetermined direction suitable for laser processing.

Through the above-mentioned steps, the wafer W is correctly placed on the chuck table 34, and, by moving the chuck table 34 to a position under the imaging means 43 and the focusing unit 4a of the laser beam applying means 4 illustrated in FIG. 1, a laser processing step can be carried out. In performing the laser processing step, first, so-called alignment is conducted in which a processing region of the wafer W to be processed is imaged by the imaging means 43 and positional matching between the focusing unit 4a and the processing region is performed. Then, laser processing is conducted by applying a pulsed laser beam while relatively moving the focusing unit 4a and the processing region of the wafer W by operating the aforementioned Y-axis direction moving means 36 and X-axis direction moving means 37. Note that, for example, for enabling alignment from the back side of the wafer W formed of silicon, the imaging means 43 in the present embodiment includes a light source for radiating infrared rays able to be permitted through silicon from the back side of the wafer W, an optical system for catching the infrared rays, an imaging element (infrared CCD) for outputting an electrical signal corresponding to the infrared rays, etc.

As laser processing conditions in the present embodiment, for example, the following processing conditions may be selected.

Wavelength of laser beam: 1064 nm
Repetition frequency: 10 kHz
Average output: 1.0 W
Processing feed velocity: 2,000 mm/second By this operation, a modified layer is formed inside the wafer W along division lines for dividing the wafer W. Here, an operational advantage of the case of using the moving base 33 formed from carbon fiber-reinforced plastic (CRFP) based on the present invention will be specifically described below, comparing the case of a conventional moving base formed from stainless steel.

First, in comparing the moving base 33 of the present invention and the conventional moving base, the laser processing apparatus 1 in the present embodiment is used, and the other configurations than the moving base are assumed to be the same. In the case of performing laser processing in the laser processing apparatus 1, the moving base 33 placed on the X-axis guide rails 322 is accelerated at a predetermined distance from the receiving position, and is put in uniform motion in the processing region. Assuming the weight of the conventional moving base is m, the weight of the moving base of the present invention is m/4. An acceleration for reaching a constant velocity at a predetermined distance in the case of the conventional moving base is assumed to be $a_1$, whereas an acceleration for reaching a constant velocity at the predetermined distance in the case of the moving base of the present invention is assumed to be $a_2$. Since the laser processing apparatus is the same in both cases, assuming that an inertial force $F_1$ in moving the moving base 33 of the present invention and an inertial force $F_2$ in moving the conventional moving base are the same, a relation:

$$F_1 = a_1 \cdot m = F_2 = a_2 \cdot (m/4)$$

exists, and, therefore, an equation:

$$a_1 = a_2/4 \quad (1)$$

is obtained.

Since the predetermined distance at which a constant velocity is reached by both the moving bases is the same, let a time at which the conventional moving base reaches a constant velocity be $t_1$, and let a time at which the moving base 33 of the present invention reaches a constant velocity be $t_2$, then an equation:

$$\int_0^{t_1} a_1 \cdot t \, dt = \int_0^{t_2} z_2 \cdot t \, dt$$

is established. From this equation, an equation:

$$(a_1/2) \cdot t_1^2 = (a_2/2) \cdot t_2^2$$

is deduced, and, by putting the equation (1) into this equation, a relation:

$$t_2 = t_1/2 \quad (2)$$

is obtained.

Assuming that a velocity that can be reached at the predetermined distance is $V_1$ for the conventional moving base and is $V_2$ for the moving base 33 of the present invention, following equations:

$$V_1 = a_1 \cdot t_1 \quad (3)$$

$$V_2 = a_2 \cdot t_2 \quad (4)$$

are established. From the equations (1) to (4), a following equation:

$$V_2 = 2 a_1 \cdot t_1 \quad (5)$$

is deduced. Assuming that the velocity $V_1$ which can be reached by the conventional moving base is 1,000 mm/second, then, since the following relation:

$$a_1 \cdot t_1 = 1{,}000 \text{ [mm/second]}$$

is deduced from the equation (3), a velocity of $$V_2 = 2{,}000 \text{ [mm/second]}$$

can be reached by the moving base 33 of the present invention.

Note that the laser processing step in the present embodiment is a known technology, and does not constitute an essential part of the present invention, and, therefore, a detailed description thereof is omitted.

The laser processing apparatus 1 in the present embodiment has the configuration as described above. Therefore, while laser processing is conducted after the wafer W is carried onto the chuck table 34 by use of the carrying means 8, it is possible carry out a new unprocessed wafer W from the unprocessed workpiece cassette 72a by operating the carrying-out means 6 and to cause the wafer W to be placed and held on the temporary placing table 51, as depicted in FIG. 7B. In other words, after the wafer W is carried from the temporary placing table 51, the carrying-out means 6 is immediately operated to perform an operation as depicted in FIGS. 4A and 4B, whereby the new wafer W can be placed on the temporary placing table 51 and be suction held there. Then, while the wafer W formerly carried onto the chuck table 34 is undergoing laser processing, the periphery detecting section 52 can be operated to detect the deviation amount of the position of the new wafer W held on the temporary placing table 51, the direction thereof and the position of the notch N, and the deviated direction thereof can be preliminarily corrected by rotating the temporary placing table 51, as required.

Figure 9:
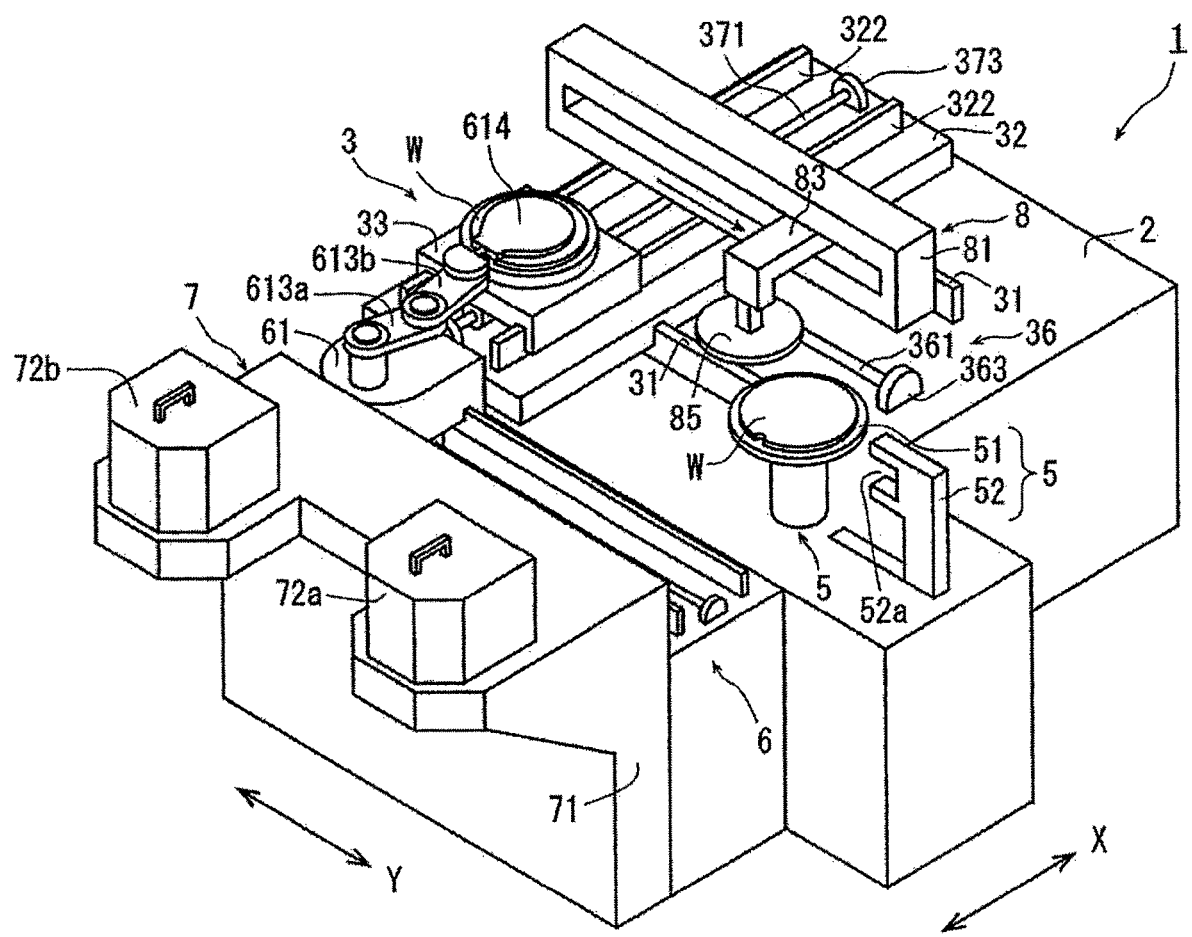
FIG. 9 is a perspective view for explaining an operation of carrying out a processed wafer from the chuck table and holding the wafer on the temporary placing table, by the carrying-out mechanism.

The wafer W formerly carried onto the chuck table 34 and subjected to laser processing is moved into the receiving position of the chuck table 34 together with the chuck table 34. When the chuck table 34 has been moved into the receiving position, as depicted in FIG. 9, the carrying-out mechanism 61 of the carrying-out means 6 is moved on the carrying-out guide rails 621 by operating the carrying-out mechanism moving means 62, and is positioned in the vicinity of the receiving position. When the carrying-out mechanism 61 has been moved into the vicinity of the receiving position, the hollow cylindrical member 612, the first arm 613a, the second arm 613b, and the robot hand 614 are operated to suck the processed wafer W on the chuck table 34 on the lower surface side of the robot hand 614, as depicted in the figure.

Figure 10:
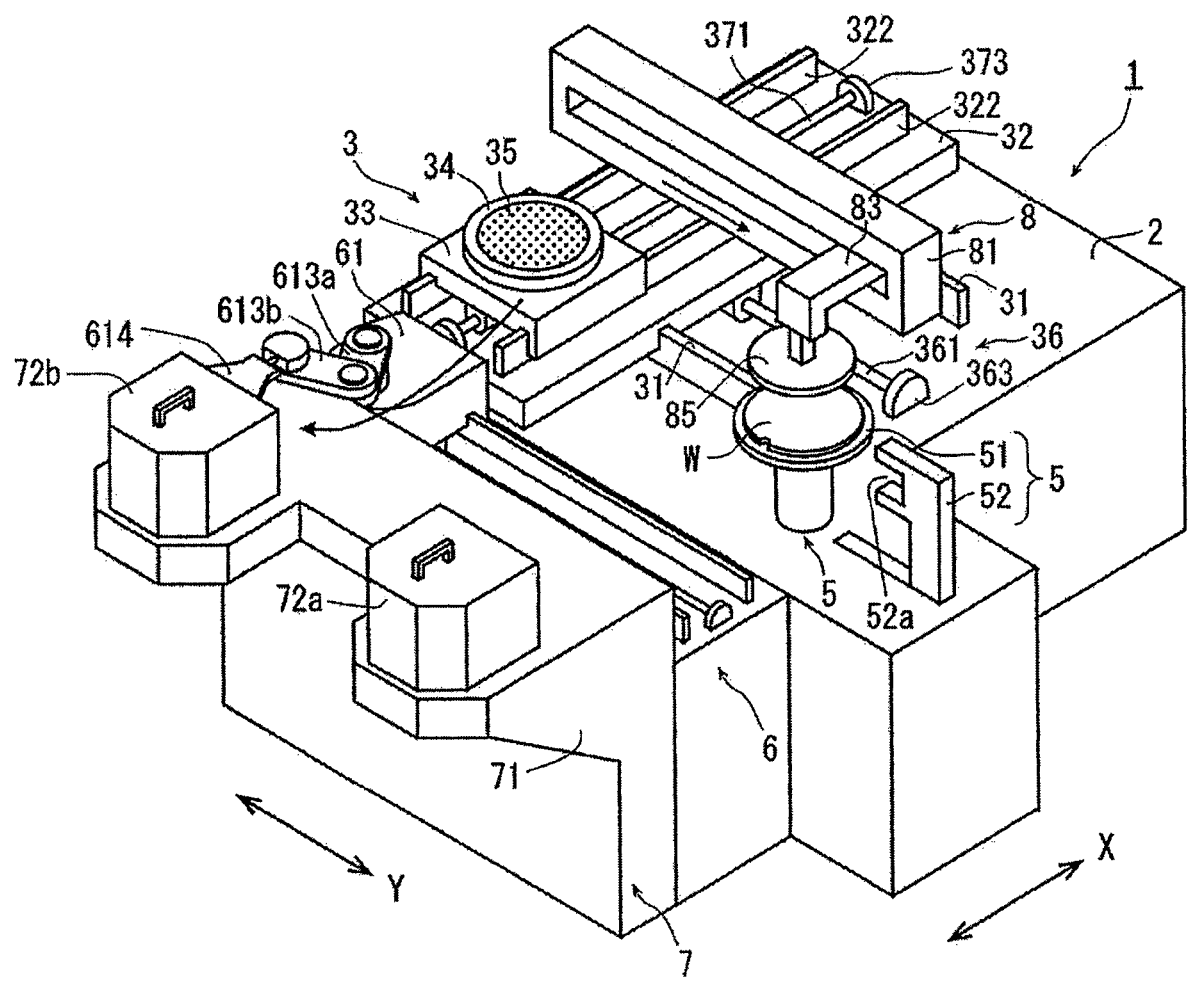
FIG. 10 is a perspective view for explaining an operation of accommodating the processed wafer into a processed workpiece cassette by the carrying-out mechanism.

When the processed wafer W has been sucked by operating the robot hand 614, the first arm 613a, the second arm 613b, and the hollow cylindrical member 612 are further operated to accommodate the processed wafer W into a predetermined position in the processed workpiece cassette 72b, as depicted in FIG. 10. Note that after the processed wafer W is sucked at the chuck table 34, the robot hand 614 is rotated such that the processed wafer W is accommodated in the cassette 72b, with its device-formed surface side up and with its back surface side down. Note that the present invention is not restricted to this mode of operation. A mode may be adopted in which the unprocessed wafers W are preliminarily accommodated in the unprocessed workpiece cassette 72a with their back surface side directed up, the back surface side of the wafer W is sucked by the robot hand 614 from above and is carried, whereas the processed wafer W on the chuck table 34 is sucked by the robot hand 614, after which the processed wafer W is accommodated into the processed workpiece cassette 72b, with its back surface side kept up, without rotating the robot hand 614.

After the wafer W is carried out from the chuck table 34 by the carrying-out mechanism 61, the carrying means 8 can be operated to carry the wafer, which is held on the temporary placing table 51 and is to be processed next, onto the chuck table 34, and correction of the direction of the notch N and the laser processing step can be performed, as described above referring to FIGS. 8A and 8B. In other words, in the laser processing apparatus configured based on the present invention, the processed wafer W can be accommodated into the processed workpiece cassette 72b in a direct manner, without passing through the route along which the unprocessed wafer W is carried. Therefore, the route of the unprocessed wafer W and the route of the processed wafer W do not overlap each other, so that the wafers W can be processed efficiently.

The present invention is not restricted to the above-described embodiment, and various modifications can be assumed. For example, while the temporary placing table 51 of the temporary placing means 5 has been composed of a transparent plate and the periphery position of the wafer W has been detected by the light emitting element 521 and the light receiving element 522 disposed in the periphery detecting section 52 in the present embodiment, this is not restrictive. In the case where the temporary placing table 51 is not composed of a transparent plate, a configuration may be adopted in which a laser beam is radiated downward on the upper side of the opening 52a of the periphery detecting section 52, and the reflected laser beam is received, to thereby detect ruggedness (projections and recesses) on the temporary placing table and detect the periphery position. Alternatively, a configuration may be adopted in which the ruggedness on the temporary placing table is detected by use of a known ultrasonic-wave or infrared-ray technique, thereby detecting the periphery position. Further, a configuration may be adopted in which the outside diameter shape is recognized by such means as image recognition processing.

While the unprocessed workpiece cassette 72a and the processed workpiece cassette 72b have been prepared in the present embodiment, the present invention is not restricted to this configuration. A configuration may be adopted in which only one cassette is prepared, and the processed wafer W is returned into a predetermined position in the cassette in which the wafer W has been accommodated before processing.

While a case of laser processing in which a laser beam of such a wavelength as to be transmitted through the wafer W is applied to the wafer W to form a modified layer inside the wafer has been described in the present embodiment, this is not restrictive of the present invention. The present invention is also applicable to a laser processing apparatus for performing so-called ablation processing by applying to the wafer W a laser beam of such a wavelength as to be absorbed in the wafer W. The present invention is applicable to laser processing apparatuses, irrespectively of the kind of the laser processing.

While an example in which the Y-axis direction moving means 36, the X-axis direction moving means 37, and the carrying-out mechanism moving means 62 are driven by the so-called linear shaft motor has been explained in the present embodiment, this is not restrictive of the present invention. A mechanism in which a so-called ball screw is rotated by a motor to convert a rotational motion of the motor into a rectilinear motion can be used as a drive source for each of the aforementioned driving means.

In the present embodiment, a configuration has been adopted in which the periphery detecting section 52 is provided with the opening 52a, and the periphery detecting section 52 is movable in the direction of the temporary placing table 51, such that the periphery of the wafer W placed on the temporary placing table 51 can be situated between the elements of the periphery detecting section 52. However, it is assumed that the wafers W to be processed by the laser processing apparatus 1 may vary in size, and the periphery position of the wafer W may not be constant. In view of this, the position at which the wafer W is situated between the light emitting and light receiving elements on the upper and lower sides of the opening 52a may be moved, as required, according to the size of the wafer W to be processed. Besides, as required, the periphery detecting section 52 may be replaced so as to cope with differences in the size of the wafer W.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A laser processing apparatus for processing a plate-shaped workpiece by applying a laser beam to the workpiece, the laser processing apparatus comprising:
   a cassette table for placing thereon a cassette in which a plurality of workpieces are accommodated;
   carrying-out means for carrying out the workpiece from the cassette placed on the cassette table;
   temporary placing means for temporarily placing the workpiece carried out by the carrying-out means;
   carrying means for carrying the workpiece from the temporary placing means to a chuck table;

a moving base for supporting the chuck table;

imaging means for detecting a region to be processed of the workpiece held on the chuck table;

X-axis direction moving means for moving the chuck table in an X-axis direction;

Y-axis direction moving means for moving of the chuck table in a Y-axis direction orthogonal to the X-axis direction; and laser beam applying means for applying a laser beam to the workpiece held on the chuck table, wherein the moving base is formed from a carbon fiber-reinforced plastic.

2. The laser processing apparatus as defined in claim 1, wherein the X-axis direction moving means includes an X-axis table having an X-axis guide rail for guiding the moving base in the X-axis direction, and a drive source for moving the moving base, and the Y-axis direction moving means includes a Y-axis guide rail for guiding the X-axis table in the Y-axis direction, and a drive source for moving the X-axis table.

3. The laser processing apparatus as defined in claim 1, wherein the carbon fiber-reinforced plastic has a specific gravity of approximately 1.5 to 2.0.

* * * * *